US007886430B2

(12) United States Patent
Ramirez et al.

(10) Patent No.: US 7,886,430 B2
(45) Date of Patent: Feb. 15, 2011

(54) METHOD OF INSTALLING CIRCUIT BOARD COMPONENT

(75) Inventors: Carlos E. Ramirez, San Sabastian, PR (US); Julio H. Monroig, San Sebastian, PR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2204 days.

(21) Appl. No.: 10/318,856

(22) Filed: Dec. 13, 2002

(65) Prior Publication Data

US 2004/0111879 A1 Jun. 17, 2004

(51) Int. Cl.
*H05K 3/30* (2006.01)

(52) U.S. Cl. .......................... 29/832; 29/825; 29/833; 29/840

(58) Field of Classification Search .................. 29/825, 29/832, 833, 840
See application file for complete search history.

(56) References Cited

U.S. PATENT DOCUMENTS 3,859,723 A * 1/1975 Hamer et al. ................ 29/840
4,127,432 A * 11/1978 Kuwano et al. ............ 156/297
4,142,286 A * 3/1979 Knuth et al. ................ 29/852
4,179,803 A * 12/1979 Wolkert ...................... 29/741
4,292,116 A * 9/1981 Takahashi et al. .......... 156/566
4,383,361 A 5/1983 Kautz
4,386,464 A * 6/1983 Yanai et al. .................. 29/834
4,394,795 A 7/1983 Goss
4,451,324 A * 5/1984 Ichikawa et al. ............ 156/562
4,452,557 A * 6/1984 Bouwknegt et al. ...... 414/796.7
4,555,847 A 12/1985 Dornes et al.
4,817,258 A 4/1989 Waters
4,833,776 A * 5/1989 Wakamiya et al. ............ 29/837
4,847,990 A * 7/1989 Patrick ........................ 29/741
4,868,979 A * 9/1989 Fukushima et al. ........... 29/840
4,965,927 A * 10/1990 Holzman ..................... 29/740
5,238,423 A 8/1993 Hills et al.
5,314,223 A * 5/1994 Harper et al. ............. 294/64.1
5,317,481 A 5/1994 Hills et al.
5,533,255 A 7/1996 Perugini et al.
5,797,177 A 8/1998 Simmons et al.
6,018,867 A 2/2000 Boe
6,244,085 B1 6/2001 Dummermuth
6,331,225 B1 * 12/2001 Sugiyama .................. 156/299
6,437,450 B1 8/2002 Baba et al.
6,446,692 B1 * 9/2002 Sugiyama .................. 156/561
6,802,118 B1 * 10/2004 Yi .............................. 29/832

FOREIGN PATENT DOCUMENTS

DE 268109 * 5/1989

* cited by examiner

*Primary Examiner*—C. J Arbes

(57) ABSTRACT

A circuit board component installation tool includes a tool head having a surface receptive of a press; a seating member connected to the tool head and receptive of at least one circuit board component; and a post attached to and extending from a side of the tool head to ensure proper orientation of the tool with respect to the circuit board component or proper orientation of the component with respect to the circuit board.

4 Claims, 6 Drawing Sheets

METHOD OF INSTALLING CIRCUIT BOARD COMPONENT

BACKGROUND OF THE INVENTION

Printed circuit boards are ubiquitous in the world today. They can be found in thousands of products ranging from toys and computers to remote controllers. Printed circuit boards are generally fabricated using a relatively thin piece of fiberglass with thin copper "wires" or traces that are printed onto a surface of the board. Electronic components are then secured to the board and interconnected by the copper traces to form a completed device.

Electronic devices are assembled on printed circuit boards ("PCBs") because such circuit boards are relatively easy to mass produce and support attachment and interconnection of numerous electronic devices. In the same way that it is relatively inexpensive to print ink onto a sheet of paper, it is typically inexpensive to "print" copper traces onto a sheet of fiberglass. And, a wide variety of trace configuration can be readily produced. It is also relatively simple to place different component parts (chips, transistors, etc.) in appropriate locations on the printed circuit board and then solder those components to secure them to the board and connect them to the copper traces.

Once completed, PCBs can be connected to a host device, including other PCBs. To connect one PCB to another, guide connectors are sometimes used. Guide connectors are mechanical connectors attached to an edge of the printed circuit board in pairs. Usually there are a pair of male connectors on a first circuit board, and pair of female connectors on a second circuit board to be connected to the first circuit board.

Generally, guide connectors are pressed onto a circuit board with a manual or electric press. After the guide connectors are pressed, the guides are usually aligned manually with pliers. The female guides are responsible for providing the circuit board alignment during the interconnection with another board. Many times, the female guides are not properly aligned because of the difficulty in doing so with pliers, and misaligned female guides result in potential damage to the mating male connector.

Similarly, present tools make it difficult to properly install pin connectors on circuit boards. Typically, a pin connector is loaded onto the circuit board and a press-fit tool is placed over the pin connector. The pin connector is then pressed with the press-fit tool using a manual or electric press. After pressing, the press-fit tool is removed and the pin-connector is checked for proper orientation and bent or damaged pins. It is presently difficult to place and press pin connectors to ensure that the pins are properly pressed while minimizing the occurrence of loose pins that can cause contact problems and shorts.

Moreover, typical tools for installing pin connectors only allow installation of a single connector at a time. In many instances two, three, or more connectors are installed on a single PCB. Therefore, using current tools, it is not uncommon to repeat the installation steps for each individual connector. This adds to the processing time and increases the chances for an improper installation.

SUMMARY

In one of many possible embodiments, a circuit board component installation tool includes a tool head having a surface receptive of a press; a seating member connected to the tool head and receptive of at least one circuit board component; and a post attached to and extending from a side of the tool head to ensure proper orientation of the tool with respect to the circuit board component or proper orientation of the component with respect to the circuit board.

In another embodiment, a circuit board connector installation tool includes an elongated head having a channel disposed therein; an elongated seating member disposed in the channel and receptive of a circuit board component; and a polarity key attached to and extending from a side of the tool head.

In another embodiment, a guide press fit tool includes a tool head comprising a surface receptive of a ram press and an open channel extending longitudinally opposite of the surface; a seating member in the open channel and receptive of a circuit board guide; and an alignment post attached to and extending from a side of the tool head.

BRIEF DESCRIPTION OF THE DRAWINGS

The accompanying drawings illustrate various embodiments of the present invention and are a part of the specification. The illustrated embodiments are merely examples and do not limit the scope of the invention.

Throughout the drawings, identical reference numbers designate similar, but not necessarily identical, elements.

DETAILED DESCRIPTION

Figure 1:
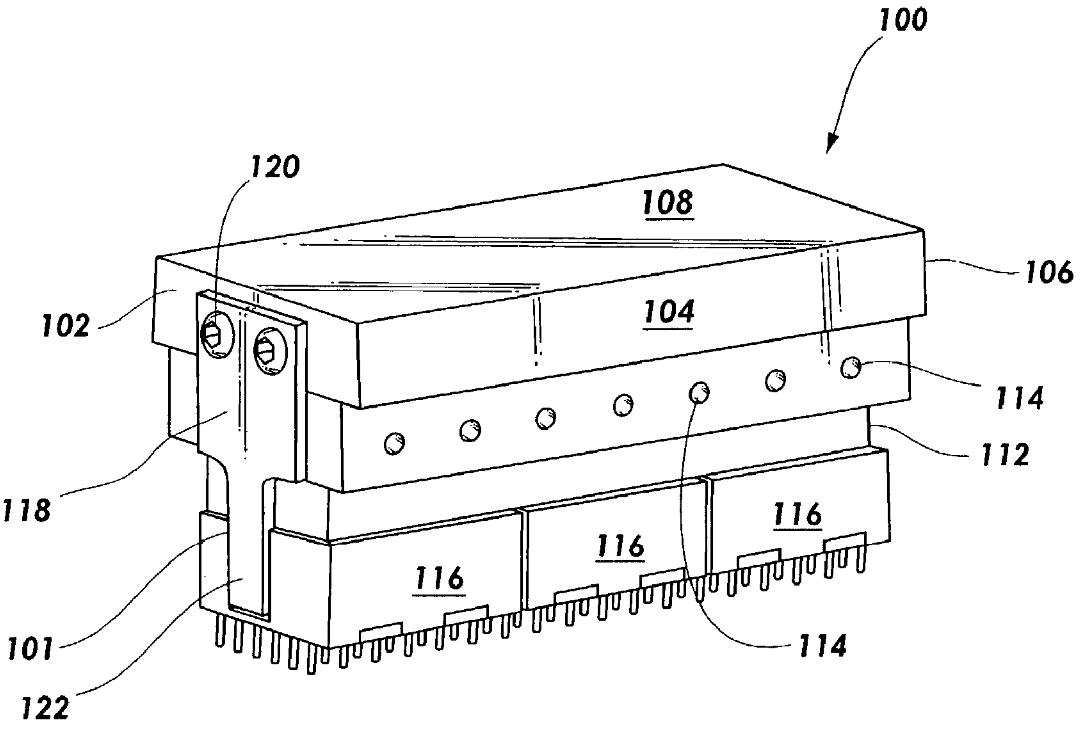
FIG. 1 is a perspective view of a circuit board component installation tool according to one embodiment.

Turning now to the figures, and in particular to FIG. 1, a circuit board component installation tool is shown according to one embodiment of the present invention. As seen in FIG. 1, the circuit board component installation tool may be embodied as a connector installation tool (100) for installing connectors on a circuit board. The tool (100) has several sides, including, but not limited to, a first end side (102) and a second longitudinal side (104).

The connector installation tool (100) also includes an elongated tool head (106) with a substantially flat upper surface (108). The substantially flat upper surface (108) provides a large contact area between the connector installation tool (100) and a manual, electrical, or hydraulic ram press when an operator is ready to press a connector into a PCB.

The tool head (106) may be made of structural materials such as metals, ceramics, composite materials and/or other appropriate materials. In a representative embodiment, the tool head (106) is made of 6061-T6 aluminum, which is commercially available from a variety of sources.

Figure 3:
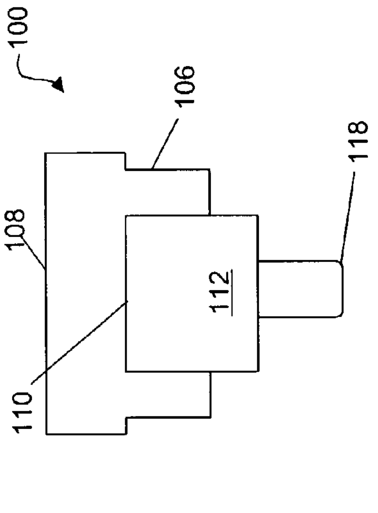
FIG. 3 is an end view of the circuit board component installation tool of FIG. 1.

As best seen in FIG. 3, the tool head (106) also includes a trough or channel (110) arranged opposite of the substantially flat upper surface (108). According to the present embodiment, the channel (110) is open and extends the full length of the tool head (106), but this is not necessarily so. The channel (110) may only extend partially along the tool head (106) in some embodiments.

The channel (110) is receptive of a seating member (112) according to the embodiment shown in FIG. 1. The seating member (112) may be attached to the tool head (106) by one or more fasteners, for example a plurality of rivets (114) holding the seating member (112) in the channel (110).

The seating member (112) may be made of structural materials such as metals, ceramics, composite materials and/or other appropriate materials. Preferably, the seating member (112) is made of steel and extends out from the channel (110). However, in some embodiments the tool head (106) and seating member (112) comprise a single integrated piece, in which case, there may be no channel (110) or fasteners needed. As seen in FIGS. 1 and 3, the tool head (106) and seating member (112) form a T-shape in cross-section generally.

The seating member (112) is a generally straight segment and is receptive of one or more circuit board components such as connectors (116). The seating member (112) can be sized and shaped to accommodate various circuit board components irrespective of size or make. According to the present embodiment, the seating member (112) is of sufficient length to hold three circuit board connectors (116), which are shown loaded on the seating member (112) in FIG. 1. The seating member (112) receives the connectors (116) in a parallel alignment with each other and, due to the straight edges of the seating member (112), which span the connectors (116), will assist a technician to notice if the connectors (116) are not properly aligned parallel to each other. Consequently, the seating member (112) advantageously facilitates the installation of all three connectors (116) simultaneously.

As discussed above, in a conventional process, each connector (116) was installed separately, adding to assembly time and increasing the chances for misalignment. However, using the connector installation tool (100), multiple connectors (116) may be installed simultaneously with little or no risk of misalignment. In addition, the length of the tool head (106) and/or the seating member (112) may be increased or decreased to accommodate more or less than three connectors (116) or other components as desired.

Arranged on a side of the connector installation tool (100) may be a post. According to the present embodiment, the post is a polarity key (118) that is attached to the first end side (102) of the tool head (106). The polarity key (118) is attached to the tool head (106) by one or more fasteners, for example rivets (120). In some embodiments, however, the polarity key (118) may be integrally formed with the tool head (106) and/or the seating member (112). According to the present embodiment, the upper portion of the polarity key (118) substantially covers an end of the channel (110) of the tool head (106).

The polarity key (118) may be made of structural materials such as metals, plastics, ceramics, composite materials and/or other appropriate materials. Preferably, the polarity key (118) is made of 304 stainless steel.

An end (122) of the polarity key (118) extends beyond the seating member (112). The purpose of the polarity key (118) is to ensure that the connectors (116) engage the seating member (112) in the proper orientation.

The polarity key (118) of the present embodiment enters or engages a recess (101) that exists on only one end of each connector (116). This recess (101) is a common and existing feature of such connectors (116). Consequently, if the tool (100) were reversed from what is shown, so that the polarity key (118) were positioned at the opposite end of the row of connectors (116), there would not be a recess on that end of the last connector (116) for the polarity key (118) to mate with.

Consequently, by making sure that the polarity key (118) properly mates with a recess in the end connector, the tool operator can ensure that at least the end connector (116) is loaded in the proper orientation with respect to the tool (100). The assumption is then made that the technician aligned all the connectors in the same orientation, e.g., that the other connectors are oriented in the same manners as the end connector (116) with which the polarity key (118) mates.

The polarity key (118) may be shaped in the T-shape shown in the figures, but this is not necessarily so. Other shapes may also be used.

Figure 4:
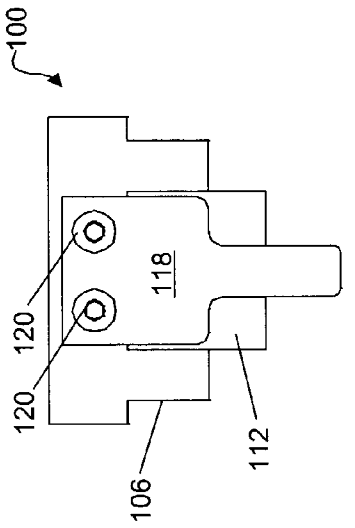
FIG. 4 is an opposite end view of the circuit board component installation tool of FIG. 3.
Figure 2:
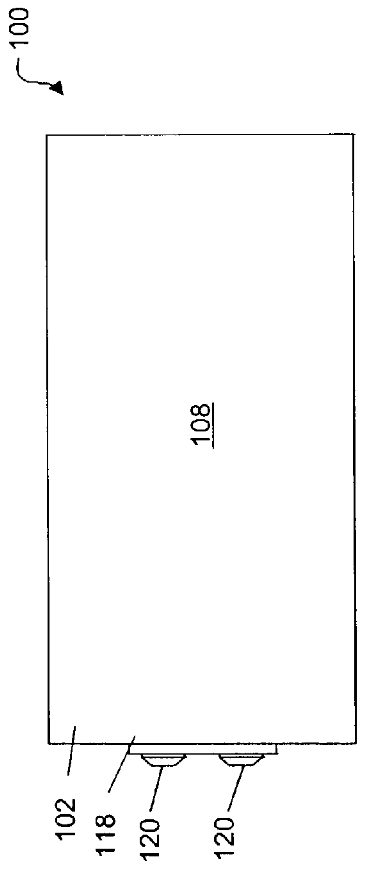
FIG. 2 is a top view of the circuit board component installation tool of FIG. 1.

Turning next to FIGS. 2-5, four principal views of the connector installation tool (100) are shown. FIG. 2 shows, in top view, the substantially flat upper surface (108) with the polarity key (118) attached via the rivets (120) to the end side (102). The end view of FIG. 3 more clearly shows the channel (110) with the seating member (112) disposed therein. The opposite end view of FIG. 4 shows the polarity key (118) substantially covering the channel (110) and extending beyond the seating member (112).

Figure 5:
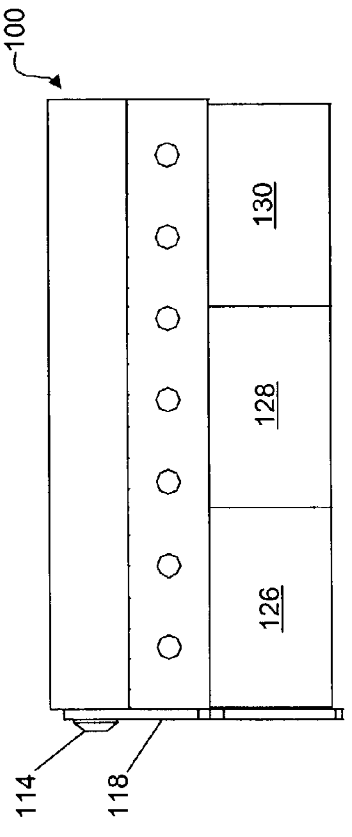
FIG. 5 is a side view of the circuit board component installation tool of FIG. 1.

FIG. 5 shows a side view of the connector installation tool (100) and includes a division of the seating member (112) into three sections (126, 128, and 130), each corresponding to a space receptive of a connector (116, FIG. 1). The three sections (126, 128, and 130) are shown in the figure as approximately equal in length, but this is not necessarily so, nor is it necessary that the seating member (112) be divided into only three sections.

Returning to FIG. 1, we will describe a method of using the connector installation tool (100) to secure one or more connectors (116) or other components on a circuit board. In the present embodiment, three connectors (116) are loaded on the circuit board. The connector installation tool (100) may then be placed over the connectors (116).

The polarity key (118) is inserted into a recess on the end of the end connector. If no such recess is present for the polarity key (118) to engage, the orientation of the tool (100) with respect to the connectors (116) is wrong, and the tool (100) is reversed.

The connectors (116) are then pressed into the circuit board by engaging a manual, electric, or hydraulic ram with the surface (108) of the tool head (106). After pressing, the connector installation tool (100) is removed.

Figure 6:
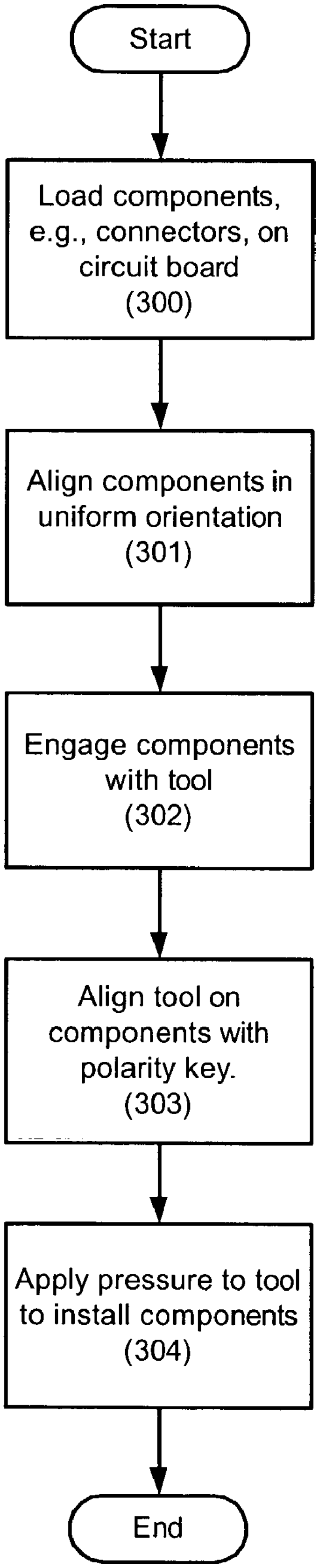
FIG. 6 is a flowchart illustrating a method of using the tool of FIGS. 1-4.

FIG. 6 is a flowchart illustrating a method of using the tool described with reference to FIGS. 1-5. As shown in FIG. 6, the components, for example, connectors, are loaded on the circuit board. (Step 300). The components are loaded in a uniform orientation and, for example, in a row or line. (Step 301). Uniform orientation can be achieved by noting the recess at one end of each connector and placing each connector in the same orientation with respect to those recesses.

Next, the tool is used to engage the components. (Step 302). The tool is aligned with respect to the components using the polarity key on the tool. (Step 303). For example, the polarity key is received in the recess in the end connector in the row of connectors. Finally, pressure is applied to the tool to install the components. (Step 304).

Figure 7:
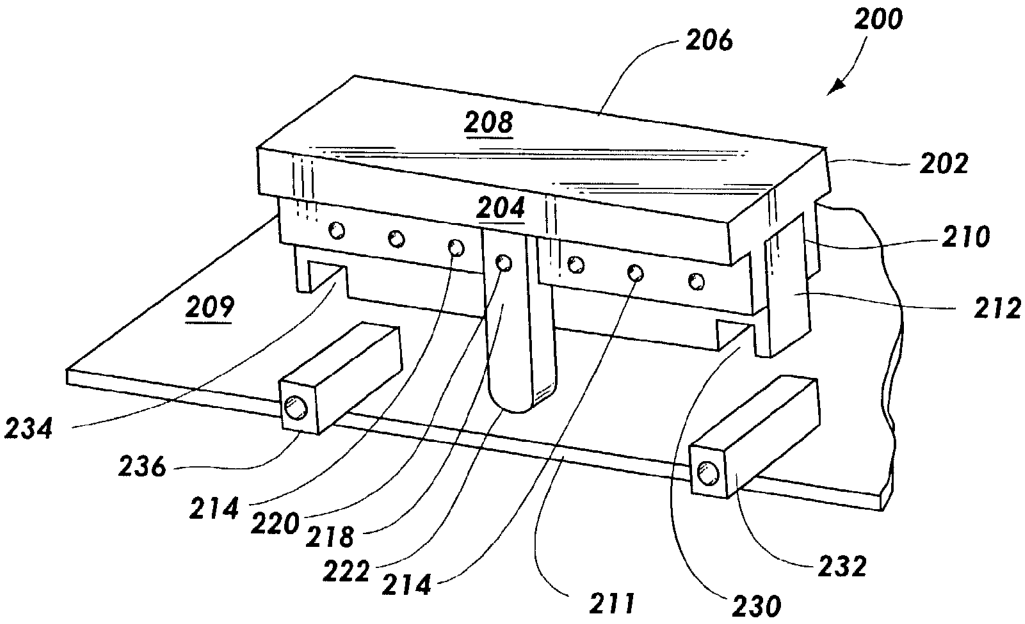
FIG. 7 is a perspective view of a circuit board component installation tool according to another embodiment.

Turning next to FIG. 7, another embodiment of a circuit board component installation tool is shown. According to the embodiment of FIG. 7, the circuit board component installation tool is a guide press fit tool (200). The guide press fit tool (200) has several sides, including, but not limited to, a first end side (202) and a second longitudinal side (204). The guide press fit tool (200) also includes an elongated tool head (206) with a substantially flat upper surface (208). The substantially flat surface (208) provides a large contact area between the guide press fit tool (200) and a manual, electric, or hydraulic ram press when an operator is ready to press a connector into a PCB (209).

The tool head (206) may be made of structural materials such as metals, ceramics, composite materials and/or other appropriate materials. Preferably, the tool head (206) is made of 6061-T6 aluminum.

The tool head (206) also includes a trough or channel (210) arranged opposite of the substantially flat upper surface (208). The channel (210) is open and extends the full length of the tool head (206) according to the present embodiment, but this is not necessarily so. The channel (210) may only extend partially along the tool head (206) in some embodiments.

The channel (210) is receptive of a seating member (212) according to the embodiment shown in FIG. 7. The seating member (212) may be attached to the tool head (206) by one or more fasteners, for example, a plurality of rivets (214) holding the seating member (212) in the channel (210). However, in some embodiments the tool head (206) and seating member (212) comprise a single integrated piece, in which case there may be no channel (210) or fasteners needed.

The seating member (212) may be made of structural materials such as metals, ceramics, composite materials and/or other appropriate materials. Preferably, the seating member (212) is made of D-2 steel and extends out from the channel (210).

Figure 8:
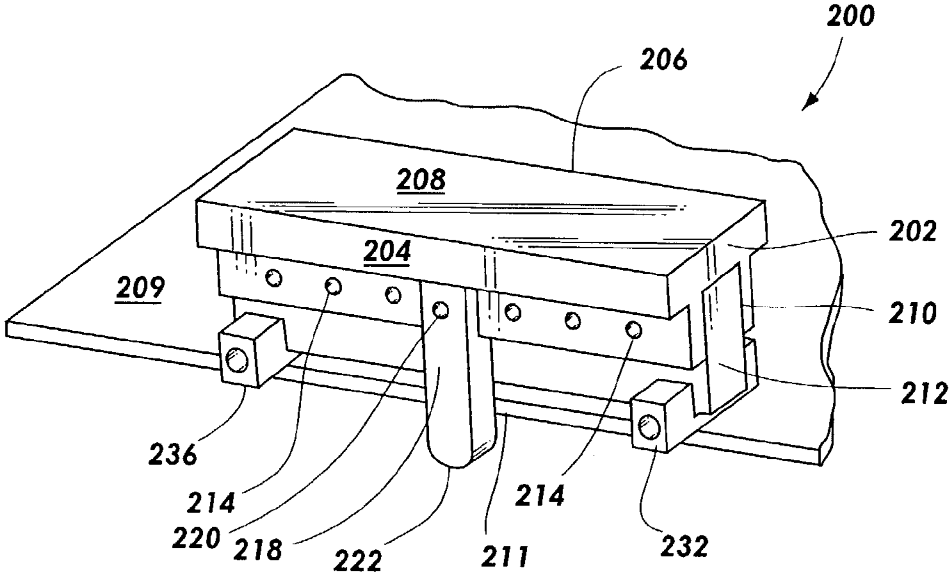
FIG. 8 is a perspective view of the circuit board component installation tool of FIG. 7 in a second position.

Referring now to FIG. 8, the tool head (206) and seating tool (212) form a T-shape in cross-section generally. The seating member (212) includes a first cavity (230) receptive of a guide such as a female guide (232). The seating member may also include a second cavity (234) parallel to and spaced from the first cavity (230). The second cavity (234) is receptive of another female guide (236). The first and second cavities (230 and 234) advantageously ensure that corresponding female guides (232 and 236) remain parallel during installation. As discussed above, prior to the present invention, female guides were aligned by hand with the aid of a pair of pliers, making it difficult and time consuming to ensure a parallel relationship between corresponding guides.

Arranged on a side of the guide press fit tool (200) may be a post. According to the embodiment of FIG. 7, the post is an alignment post (218) that is attached to the longitudinal side (204) of the tool head (206). The alignment post (218) is attached to the tool head (206) by one or more fasteners, for example, rivet (220). In some embodiments, however, the alignment post (218) may be integrally formed with the tool head (206) or seating member (212).

The alignment post (218) may be made of structural materials such as metals, plastics, ceramics, composite materials and/or other appropriate materials. Preferably, the alignment post (218) is made of aluminum.

An end (222) of the alignment post (218) extends beyond the seating member (212) and facilitates engagement of the guide press fit tool (200) with the PCB (209) such that the female guides (232 and 236) are installed and aligned perpendicular to a side surface (211) of the PCB (209). The alignment post (218) is urged against and engages the side surface (211) of the PCB (209). If the alignment post (218) is pressed flat against the side (211) of the PCB (209), the seating member (212), to which the post (218) is attached, will be parallel to the edge (211) of the PCB (209). Consequently, the cavities (230 and 234) will run perpendicular to the edge (211) of the PCB (209) and will ensure that the female guides (232 and 236) are loaded in the proper orientation, i.e., perpendicular to the edge (211) of the PCB (209).

The alignment post (218) may be shaped in the generally I-shape configuration shown in the figure, but this is not necessarily so. Other shapes, such as polygonal shapes, that present a flat surface which can be arranged parallel to the seating member (212) and lie flat against the edge (211) of the PCB (209) may also be used. There may also be additional alignments posts added if desired. While the present embodiment shows the alignment post (218) arranged substantially equidistant from the ends of the guide press fit tool (200), this is not necessarily so. The alignment post (218) may also be spaced off-center. FIG. 8 shows the guide press fit tool (200) with the cavities (230 and 234) engaging the female guides (232 and 236), and the alignment post (218) engaging the side surface (211) of the PCB (209) to ensure alignment of the female guides (211).

Figure 10:
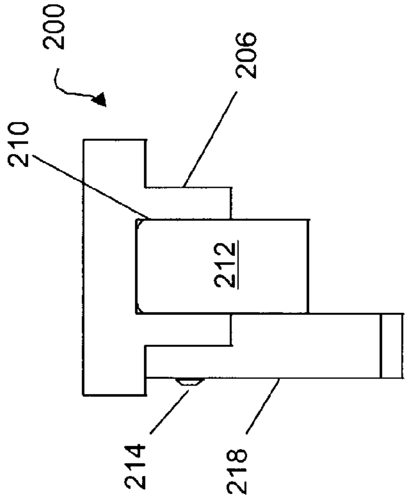
FIG. 10 is an end view of the circuit board component installation tool of FIG. 7.
Figure 9:
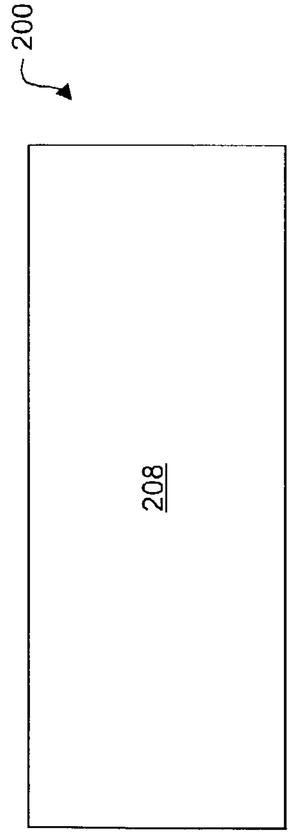
FIG. 9 is a top view of the circuit board component installation tool of FIG. 7.
Figure 11:
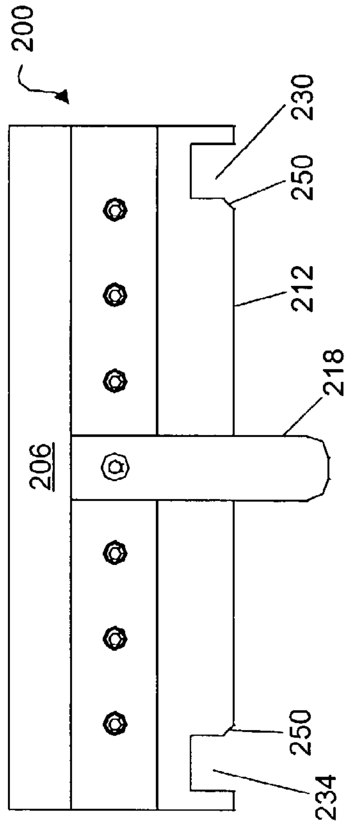
FIG. 11 is a side view of the circuit board component installation tool of FIG. 7.

Turning next to FIGS. 8-10, three principal views of the guide press fit tool (200) of the embodiment of FIG. 7 are shown. FIG. 9 shows in top view the substantially flat upper surface (208). The end view of FIG. 10 more clearly shows the channel (210) with the seating member (212) disposed therein and the alignment post (218) attached via the rivet (214). FIG. 11 shows a side view of the guide press fit tool (200) and includes the first and second cavities (230 and 234) of the seating member (212), each receptive of a guide (232 and 236, FIG. 7). In some embodiments, the edges of the cavities (230 and 234) may be tapered (250) to facilitate placement of the tool (200) over the guides (232, 236).

Returning to FIGS. 6 and 7, operation of the guide press fit tool (200) is described. One or more guides are loaded on a circuit board (209). In the present embodiment, two female guides (232 and 236) are loaded on the circuit board (209). The guide press fit tool (200) may then be placed over the two female guides (232 and 236), with the alignment post (218) engaging the side surface (211) of the PCB (209). The female guides (232 and 236) are then pressed into the circuit board (209) by engaging a manual, electric, or hydraulic ram with the surface (208) of the tool head (206). After pressing, the guide press fit tool (200) is removed.

Figure 12:
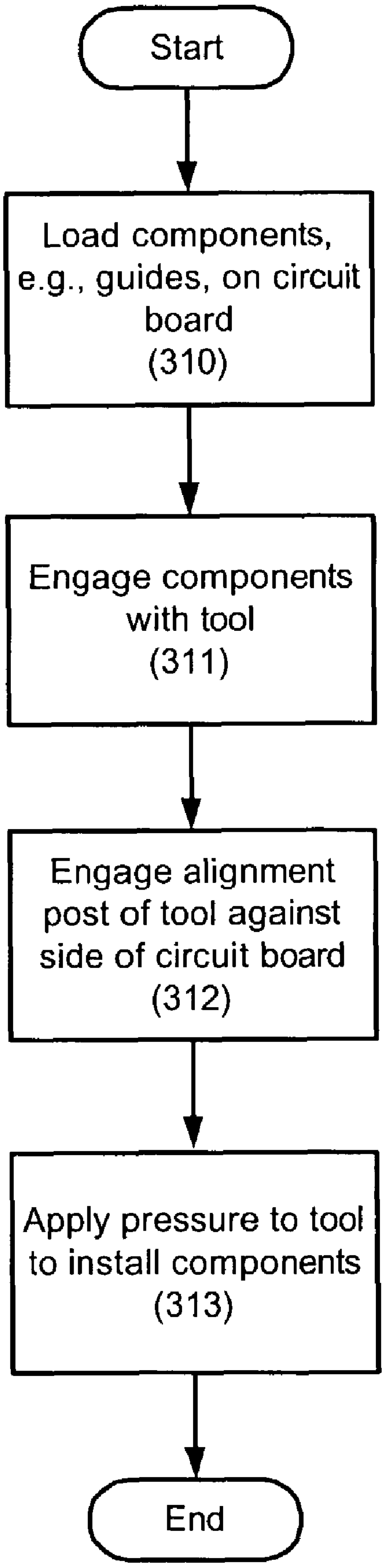
FIG. 12 is a flowchart illustrating a method of using the tool of FIGS. 6-11.

FIG. 12 is a flowchart illustrating a method of using the tool described above with reference to FIGS. 7-11. As shown in FIG. 12, the components, for example, guides, are loaded onto the circuit board. (Step 310). As stated above, the guides are responsible for providing the circuit board alignment during the interconnection with another board. Consequently, the guides are to be installed so as to extend over and perpendicular to an edge of the circuit board.

Next, the tool is used to engage the components. (Step 311). This entails receive the guide or guides in recesses of the tool which are perpendicular to the seating member and rear surface of the alignment post of the tool. The alignment post of the tool is then placed flat against the side of the circuit board to align the guides perpendicular to the edge of the circuit board. (Step 312). Finally, pressure is applied to the tool to install the components. (Step 313).

The preceding description has been presented only to illustrate and describe the invention. It is not intended to be exhaustive or to limit the invention to any precise form disclosed. Many modifications and variations are possible in light of the above teachings. It is intended that the scope of the invention be defined by the following claims.

What is claimed is:

1. A method of installing circuit board components comprising:

engaging first and second guides with first and second parallel cavities of a press fit tool; and pressing said first and second guides into a circuit board by applying pressure to said tool.

2. The method of claim 1, wherein said pressing said first and second guides into the circuit board by applying pressure to said tool further comprises actively applying said pressure to said tool.

3. A method of installing circuit board components comprising:

engaging first and second guides with first and second parallel cavities of a press fit tool; and pressing said first and second guides into a circuit board by applying pressure to said tool; and placing first and second guides on said circuit board and placing said press fit tool over said first and second guides.

4. The method of claim 3, further comprising engaging an alignment post of said press fit tool with said circuit board to align said first and second guides with said circuit board.

* * * * *